US010739902B2

(12) United States Patent
Seok et al.

(10) Patent No.: US 10,739,902 B2
(45) Date of Patent: Aug. 11, 2020

(54) INPUT APPARATUS AND CONTROL METHOD OF THE SAME

(71) Applicants: Hyundai Motor Company, Seoul (KR); Kia Motors Corporation, Seoul (KR)

(72) Inventors: Donghee Seok, Gyuenggi-do (KR); Gideok Kwon, Seoul (KR); Jong Bok Lee, Gyeonggi-do (KR); HeeJin Ro, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 15/830,678

(22) Filed: Dec. 4, 2017

(65) Prior Publication Data

US 2019/0095030 A1 Mar. 28, 2019

(30) Foreign Application Priority Data

Sep. 27, 2017 (KR) ........................ 10-2017-0125126

(51) Int. Cl.
| | |
|---|---|
| *G09G 5/00* | (2006.01) |
| *G06F 3/041* | (2006.01) |
| *G06F 3/044* | (2006.01) |
| *B60K 37/06* | (2006.01) |
| *H03K 17/96* | (2006.01) |
| *G06F 3/038* | (2013.01) |

(52) U.S. Cl.
CPC ............ *G06F 3/0416* (2013.01); *B60K 37/06* (2013.01); *G06F 3/038* (2013.01); *G06F 3/044* (2013.01); *H03K 17/9622* (2013.01); *B60K 2370/139* (2019.05); *B60K 2370/141* (2019.05); *B60K 2370/1438* (2019.05); *B60K 2370/1446* (2019.05); *B60K 2370/199* (2019.05); *G06F 2203/04101* (2013.01); *H03K 2217/94026* (2013.01)

(58) Field of Classification Search
CPC .................. G06F 3/0416; G06F 3/044; G06F 2203/04101; B60K 37/06; B60K 2350/1028; B60K 2370/199
USPC .......................................... 345/173; 200/600
See application file for complete search history.

(56) References Cited

U.S. PATENT DOCUMENTS

| | | | | |
|---|---|---|---|---|
| 2004/0189100 | A1* | 9/2004 | Gasperi | G01D 5/24 307/125 |
| 2009/0284495 | A1* | 11/2009 | Geaghan | G06F 3/0416 345/174 |
| 2011/0267310 | A1 | 11/2011 | Tsukahara et al. | |

(Continued)

FOREIGN PATENT DOCUMENTS

| | | |
|---|---|---|
| JP | 2010257046 A | 11/2010 |
| JP | 2012138026 A | 7/2012 |

(Continued)

*Primary Examiner* — Jennifer T Nguyen
(74) *Attorney, Agent, or Firm* — Mintz Levin Cohn Ferris Glovsky and Popeo, P.C.; Peter F. Corless

(57) ABSTRACT

An input apparatus for a vehicle is provided with a plurality of sensor electrodes; and a controller is configured to determine a capacitance reference value of the input apparatus based on information about sensor values collected from a subset of sensor electrodes, which is randomly selected from the plurality of sensor electrodes.

14 Claims, 8 Drawing Sheets

(56) References Cited

U.S. PATENT DOCUMENTS

| | | | |
|---|---|---|---|
| 2012/0037485 A1* | 2/2012 | Sitarski | H03K 17/955 200/600 |
| 2012/0268422 A1 | 10/2012 | Hirakawa et al. | |
| 2013/0033356 A1* | 2/2013 | Sitarski | G06F 13/42 340/1.1 |
| 2013/0106436 A1* | 5/2013 | Brunet | G06F 3/0418 324/613 |
| 2013/0257786 A1* | 10/2013 | Brown | G06F 3/044 345/174 |
| 2014/0210764 A1* | 7/2014 | Shepelev | G06F 3/044 345/174 |
| 2016/0147319 A1* | 5/2016 | Agarwal | G06F 3/0418 345/173 |
| 2016/0231856 A1* | 8/2016 | Suwald | G06F 3/0416 |
| 2018/0107302 A1* | 4/2018 | Takada | G06F 3/0414 |
| 2019/0087052 A1* | 3/2019 | Vandermeijden | G06F 3/0418 |

FOREIGN PATENT DOCUMENTS

| | | |
|---|---|---|
| JP | 2013130402 A | 7/2013 |
| JP | 2015064859 A | 4/2015 |
| KR | 10-1328277 B1 | 11/2013 |
| KR | 10-1509354 B1 | 4/2015 |

\* cited by examiner

INPUT APPARATUS AND CONTROL METHOD OF THE SAME

CROSS-REFERENCE TO RELATED APPLICATION(S)

This application claims under 35 U.S.C. § 119(a) the benefit of Korean Patent Application No. 10-2017-0125126, filed on Sep. 27, 2017 in the Korean Intellectual Property Office, the entire contents of which are incorporated herein by reference.

BACKGROUND

1. Technical Field

The present disclosure relates to an input apparatus for a vehicle and a control method of the input apparatus, more particularly, to an input apparatus for a vehicle provided with a plurality of sensor electrodes and a control method of the same.

2. Description of Related Art

A capacitive proximity sensor technology is configured to detect a change in capacitance of a proximity sensor caused by an object that is approaching, and to determine whether the object is in proximity or not, by comparing the detected capacitance with a reference value. Such a technology may optimize performance by calibrating the reference value based on ambient environmental information such as temperature and humidity.

However, proximity sensor technology may suffer from difficulties, e.g., in a sensing sensitivity of the proximity sensor which is reduced by ambient noise. For example, when a smart phone, which may be held on the driver's knee or a console area, is placed in a detection area of the proximity sensor, the proximity sensor may be operated differently from the intention of an operator. Recently, various research has been conducted to improve the sensing sensitivity of the proximity sensor.

SUMMARY

Therefore, it is an aspect of the present disclosure to provide an input apparatus provided with a plurality of sensor electrodes and configured to set a capacitance reference value based on information about sensor values of some (i.e., a subset of) sensor electrodes among the plurality of sensor electrodes, and a control method of the same. Particularly, when setting the capacitance reference value, the input apparatus is configured to use information about sensor values of sensor electrodes except information about sensor values of sensor electrodes that are inactive since noise has been detected.

Additional aspects of the present disclosure will be set forth in part in the description which follows and, in part, will be obvious from the description, or may be learned by practice of the present disclosure.

In accordance with an aspect of the present disclosure, an input apparatus is provided. The input apparatus including: a plurality of sensor electrodes; and a controller configured to determine a capacitance reference value of the input apparatus based on information about sensor values collected from a subset of sensor electrodes, which is randomly selected from the plurality of sensor electrodes.

The controller may determine a capacitance reference value of the input apparatus based on information about the sensor values collected from the subset of sensor electrodes, which is randomly selected except a currently used sensor electrode from the plurality of sensor electrodes.

The controller may determine a sensor electrode in which noise information is detected, among the plurality of sensor electrodes, as the currently used sensor electrode.

The controller may convert the sensor electrode, in which noise information is detected among the plurality of sensor electrodes, into an inactive state.

The controller may determine a sensor electrode outputting a sensor value out of a reference range for equal to or longer than a first predetermined period of time, as the sensor electrode in which noise information is detected among the plurality of sensor electrodes.

When it is detected that a sensor value of the inactive sensor electrode is in the reference range, the controller may convert the inactive sensor electrode into an active state.

The controller may determine a sensor electrode with which information about user proximity gesture is detected among the plurality of sensor electrodes as the currently used sensor electrode.

The controller may determine a capacitance reference value of the input apparatus based on information about the sensor values collected from the subset of sensor electrodes, which is not adjacent to each other among the plurality of sensor electrodes.

The plurality of sensor electrodes may be arranged at a certain interval.

The plurality of sensor electrodes may be arranged in a certain shape.

The input apparatus may be installed in a center fascia of a vehicle.

In accordance with another aspect of present disclosure, a control method of an input apparatus is provided, the method including: collecting information about sensor values from a plurality of sensor electrodes; and determining a capacitance reference value of the input apparatus based on information about the sensor values from a subset of sensor electrodes, which is randomly selected from the plurality of sensor electrodes.

The determination of the capacitance reference value of the input apparatus may comprise determining a capacitance reference value of the input apparatus based on information about sensor values collected from a plurality of sensor electrodes, which is selected except a currently used sensor electrode from the plurality of sensor electrodes.

The control method further comprises determining a sensor electrode in which noise information is detected among the plurality of sensor electrodes as the currently used sensor electrode.

The control method further comprises converting the sensor electrode, in which noise information is detected among the plurality of sensor electrodes, into an inactive state.

The determination of the sensor electrode in which noise information is detected among the plurality of sensor electrodes, as the currently used sensor electrode, may comprise determining a sensor electrode outputting a sensor value out of a reference range for equal to or longer than a first predetermined period of time, as a sensor electrode, in which noise information is detected among the plurality of sensor electrodes.

The control method may further comprises determining a sensor electrode, in which information about user proximity gesture is detected among the plurality of sensor electrodes, as the currently used sensor electrode.

The determination of the capacitance reference value may comprise determining a capacitance reference value of the input apparatus based on information about sensor values collected from a plurality of sensor electrodes, which is not adjacent to each other among the plurality of sensor electrodes.

BRIEF DESCRIPTION OF THE DRAWINGS

These and/or other aspects of the disclosure will become apparent and more readily appreciated from the following description of embodiments, taken in conjunction with the accompanying drawings of which.

DETAILED DESCRIPTION

Figure 1:
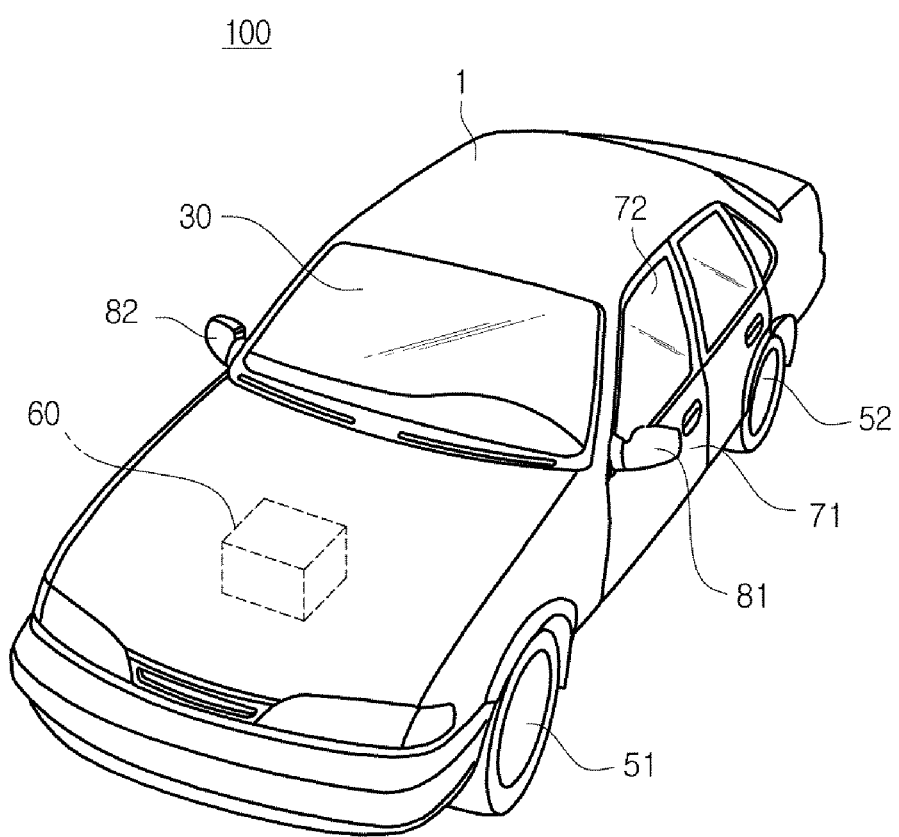
FIG. 1 is a view illustrating an exterior of a vehicle in accordance with an embodiment of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Like reference numerals refer to like elements throughout the description. Well-known functions or constructions are not described in detail since they would obscure the one or more exemplar embodiments with unnecessary detail.

It will be understood that when an element is referred to as being "connected" another element, it can be directly or indirectly connected to the other element, wherein the indirect connection includes "connection via a wireless communication network".

It will be understood that, although the terms first, second, third, etc., may be used herein to describe various elements, but elements are not limited by these terms. These terms are only used to distinguish one element from another element.

An identification code is used for the convenience of the description but is not intended to illustrate the order of each step. Each step may be implemented in the order different from the illustrated order unless the context clearly indicates otherwise.

Reference will now be made in detail to embodiments of the present disclosure, examples of which are illustrated in the accompanying drawings. FIG. 1 is a view illustrating an exterior of a vehicle 100 in accordance with an embodiment of the present disclosure.

Referring to FIG. 1, according to an embodiment, the vehicle 100 may include a body 1 forming an exterior of the vehicle, a front glass 30 providing a front view of the vehicle 100 to a driver inside the vehicle 100, vehicle wheels 51 and 52 moving the vehicle 100, a driving device 60 rotating the vehicle wheels 51 and 52, a door 71 closing the inside of the vehicle 100 from the outside, and side mirrors 81 and 82 providing a view of a rear side of the vehicle 100 to the driver.

The front glass 30 may be provided on an upper portion of the front of the body 1 to allow a driver inside the vehicle 100 to acquire visual information about the front of the vehicle 100 and may be referred to as "windshield glass".

The vehicle wheels 51 and 52 may include a front wheel 51 provided on a front of the vehicle 100 and a rear wheel 52 provided on a rear of the vehicle 100. The driving device 60 may supply a torque to the front wheel 51 and the rear wheel 52 so that the body 1 may be moved forward and backward. The driving device 60 may employ an engine configured to generate a torque by burning fossil fuel or a motor configured to generate a torque by receiving power source from a capacitor (not shown).

The door 71 may be rotatably provided on a right side and a left side of the body 1. When the door 71 is opened, a driver may be allowed to be seated in the vehicle 100, and when the door 71 is closed, the inside of the vehicle 100 may be closed from the outside. The door 71 may be provided with a window 72 that allows a driver to see the outside or the inside from the outside. According to the embodiment, the window 72 may be openable and closable and configured to allow a driver to see from only one side.

The side mirrors 81 and 82 may include a left side mirror 81 provided on the left side of the body 1 and a right side mirror 82 provided on the right side of the body 1, and may allow a driver inside the vehicle 100 to acquire visual information of the lateral side and the rear side of the vehicle 100.

Figure 2:
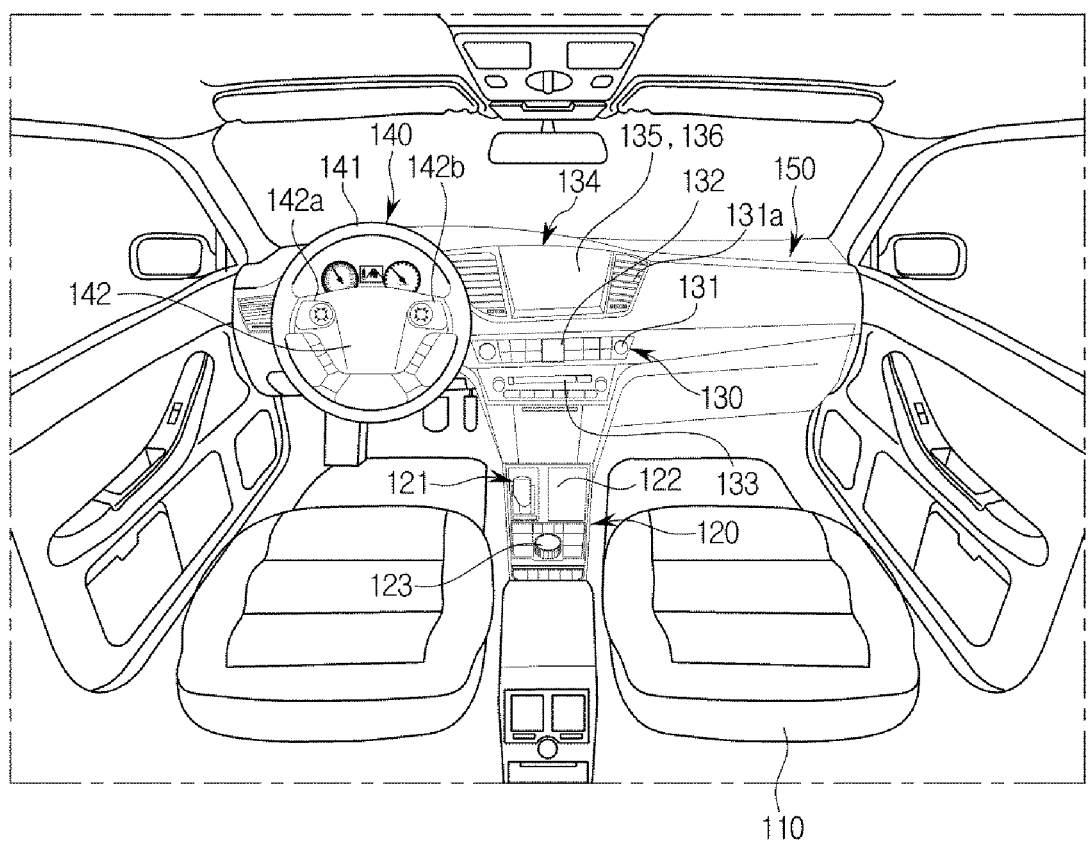
FIG. 2 is a view illustrating a configuration of an interior of the vehicle in accordance with an embodiment of the present disclosure.

FIG. 2 is a view illustrating a configuration of an interior of the vehicle 100 in accordance with an embodiment of the present disclosure. Referring to FIG. 2, a seat 110 in which a driver or a passenger is seated, and a dashboard 150 in which a gear box 120, a center fascia 130, and a steering wheel 140 are provided may be provided in the vehicle 100.

In the gear box 120, a gear lever 121 configured to change a speed of the vehicle 100 and a touch pad 122 configured to control an operation of the vehicle 100 may be installed. Alternatively, a dial operating portion 123 may be selectively provided in the gear box 120, as needed.

In the center fascia 130, an air conditioning device 131, a clock 132, an audio device 133 and an audio, video, and navigation (AVN) device 134 may be installed.

The air conditioning device 131 may keep an air inside the vehicle 100 in fresh by controlling temperature, humidity, air cleanliness, and the flow of air of the inside of the vehicle 100. The air conditioning device 131 may include at least one discharging port 131a installed in the center fascia 130 and configured to discharge air. A button or a dial may be installed in the center fascia 130 to control the air conditioning device 131. A user, such as a driver, may control the air conditioning device 131 by using a button disposed on the center fascia 130.

The clock 132 may be provided around the button or the dial controlling the air conditioning device 131.

The audio device 133 may include an operation panel in which a number of buttons are provided to perform functions of the audio device 133. The audio device 133 may provide a radio mode configure to provide a radio function, and a media mode configured to play an audio file of various storage media in which the audio file is stored.

The AVN device 134 may be formed to be embedded in the center fascia 130 of the vehicle 100. The AVN device 134 may be configured to integrally perform the audio function, the video function and the navigation function by the operation of the AVN device 134. The AVN device 134 may include an input 135 configured to receive a user command related to the AVN device 134, and a display 136 configured to display a screen related to the audio function, a screen related to the video function and a screen related to the navigation function.

In the center fascia 130, an input apparatus 200 configured to recognize a user proximity gesture may be provided. In the description, the input apparatus 200 may represent a concept including a proximity sensor module configured to recognize a user proximity gesture based on a variation of capacitance caused by the user gesture.

Figure 3:
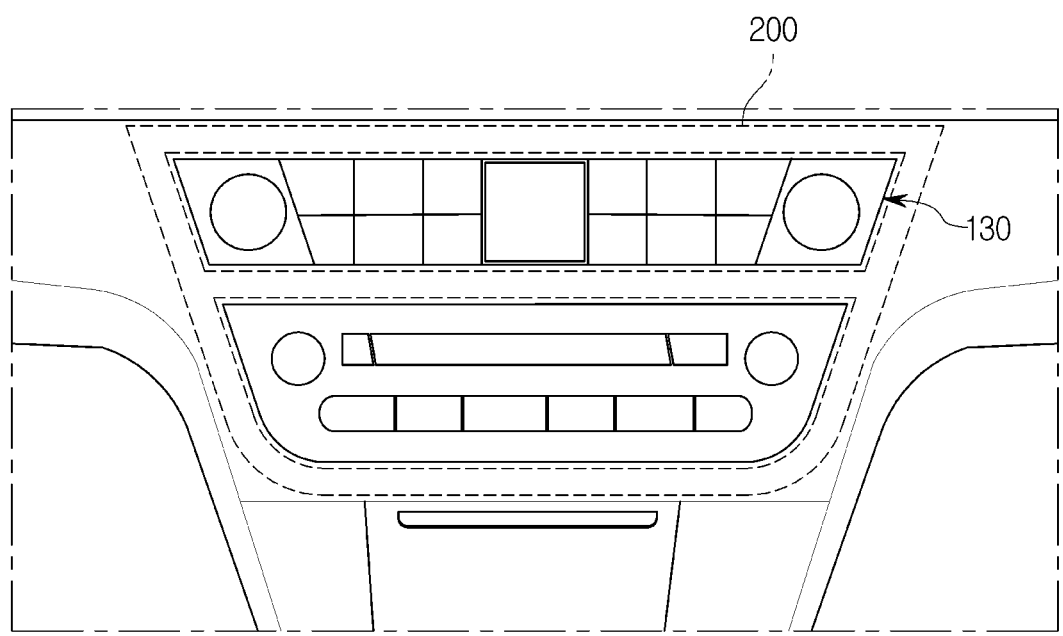
FIG. 3 is a view illustrating an input apparatus installed in the center fascia 130 in accordance with an embodiment.

FIG. 3 is a view illustrating an input apparatus 200 installed in the center fascia 130 in accordance with an embodiment.

Referring to FIG. 3, the input apparatus 200 may be installed in a rear surface of an edge portion of the panel of the center fascia 130 according to the arrangement of the buttons provided in the panel of the center fascia 130 so that the input apparatus 200 easily collects information about the user gesture.

FIG. 3 illustrates that a gesture detection area of the input apparatus 200 is provided around the air conditioning device 131, the clock 132 and the audio device 133, but the installation of the input apparatus 200 is not limited thereto. For example, the input apparatus 200 may be installed according to the arrangement of the display 136 of the AVN device 134 and the discharging port 131a of the air conditioning device 131 and alternatively, the input apparatus 200 may be designed in a variety of methods according to the intention of the designer.

The input apparatus 200 receives control commands for various devices installed in the vehicle 100 based on user proximity gestures performed in the detection area. However, according to the position where the input apparatus 200 is fixed, a noise, which is caused by a device such as a smart phone placed on a driver's knee, a passenger's knee on a passenger seat, a console, or the like may occur in the detection area of the input apparatus 200, and the noise may cause malfunction of the input apparatus 200.

Hereinafter the noise refers to an external stimulus generated in the detection area of the input apparatus 200 and is defined as a concept including all external stimuli that may cause the malfunction of the input apparatus 200.

The present disclosure is related to the input apparatus 200 capable of filtering the noise through the arrangement and the control of sensor electrodes and a control method of the input apparatus 200, and a description thereof will be described in details.

The steering wheel 140 may be a device configured to adjust a driving direction of the vehicle 100, and may include a rim 141 held by the driver and a spoke 142 connected to a steering system of the vehicle 100 and configured to connect the rim 141 to a hub of a rotation shaft for the steering. According to the embodiment, manipulation devices 142a and 142b may be formed in the spoke 142 to control various devices inside the vehicle 100, such as an audio device.

According to the embodiment, the dashboard 150 may further include various gauge boards indicating a driving speed and revolutions per minute (RPM) or fuel residual quantity of the vehicle 100, and a globe box in which various things are stored.

Hereinafter the input apparatus 200 according to the embodiment will be described in detail with reference to the accompanying drawings.

According to the embodiment, the input apparatus 200 may be installed in a range for detecting the user proximity gesture regardless of the location. For example, the input apparatus 200 may be installed in an interior of vehicles, an interior of trains and airplanes, a control panel of electronics, and an entrance door, but the installation position of the input apparatus 200 is not limited thereto. Hereinafter for the understanding, a case in which the input apparatus 200 is installed in the center fascia 130 of the vehicle 100 will be described as an example FIG. 4 is a conceptual diagram illustrating a structure of the input apparatus 200 in accordance with an embodiment.

Figure 4:
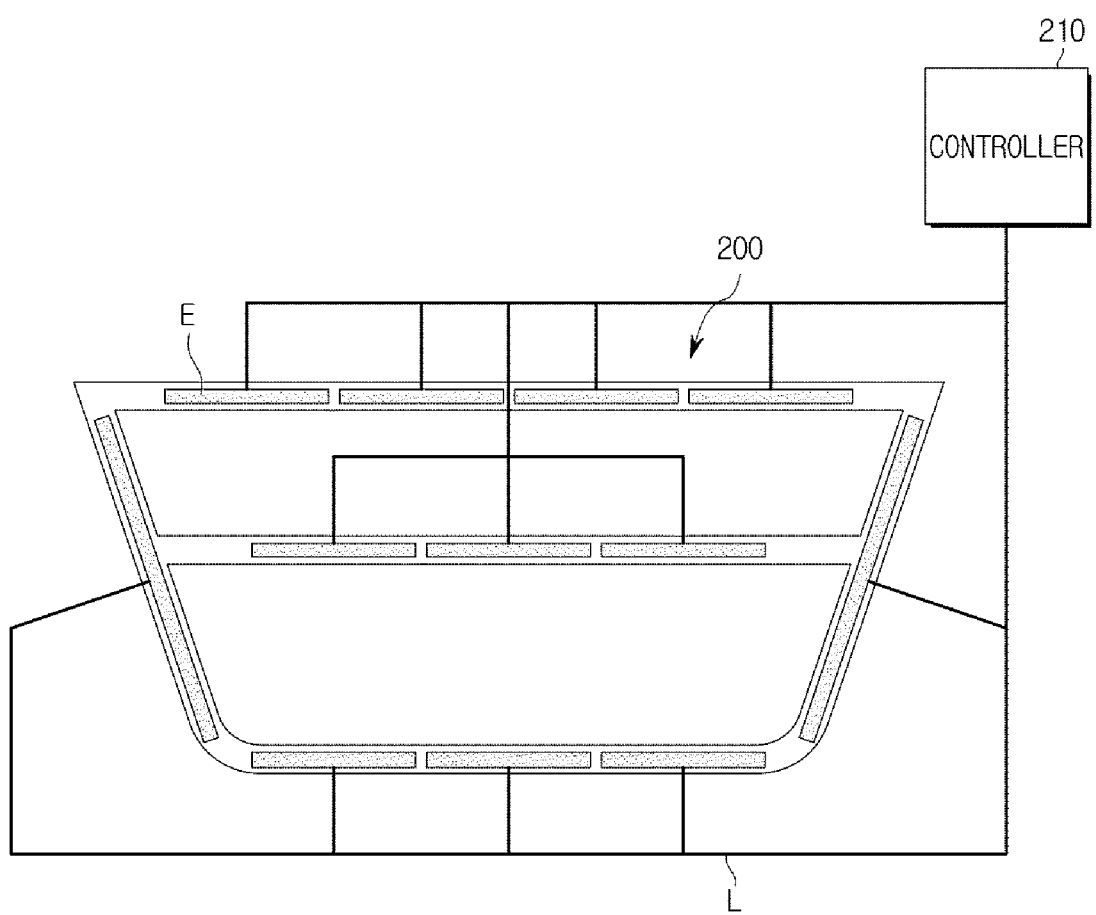
FIG. 4 is a conceptual diagram illustrating a structure of the input apparatus in accordance with an embodiment.

Referring to FIG. 4, according to an embodiment, the input apparatus 200 may include a plurality of sensor electrodes (E) and a controller 210 configured to determine capacitance reference values of the input apparatus 200 based on information about sensor values that is collected from the plurality of sensor electrodes (E).

The shape and the number of the plurality of sensor electrodes (E) may vary according to a position in which the input apparatus 200 is installed. According to an embodiment, the input apparatus 200 may be installed in the center fascia 130 and thus sensor electrodes of the input apparatus 200 may be arranged in the shape of the arrangement of the buttons provided in the center fascia 130.

The plurality of sensor electrodes (E) may be connected to the controller 210 through a connecting portion (L). The information about the sensor values collected from the plurality of sensor electrodes (E) may be transmitted to the controller 210. Hereinafter a single sensor electrode and a connecting portion configured to connect the corresponding sensor electrode to the controller 210 may be defined as a channel.

The controller 210 may include a memory (not shown) configured to store a data related to algorisms or programs implementing algorisms to control components in the input apparatus 200, and a processor (not shown) configured to perform the above mentioned operation by using the stored data. The memory and the processor may be implemented by using a separate chip or using a single chip.

The controller 210 may determine capacitance reference values of the input apparatus 200 based on information about sensor values collected from a subset of sensor electrodes, which are randomly selected from the plurality of sensor electrodes.

Particularly, the controller 210 may determine capacitance reference values of the input apparatus 200 based on the information about the sensor values collected from the subset of sensor electrodes, which are randomly selected from the plurality of sensor electrodes except a sensor electrode that is currently used. According to an embodiment, since the input apparatus 200 determines capacitance reference values of the input apparatus 200 based on the information about sensor values collected from the subset of sensor electrodes, which are randomly selected from the plurality of sensor electrodes, it may be possible to reduce an amount of data that is processed when calculating reference values, and to improve a processing speed.

Hereinafter a sensor electrode that is currently used is defined as a sensor electrode in which noise information is detected or information about user proximity gestures is detected. In other words, when a certain sensor value is output from a sensor electrode, the controller 210 may determine the corresponding sensor electrode as a currently used sensor electrode.

The controller 210 may determine a sensor electrode in which noise information is detected, among the plurality of sensor electrodes, as a currently used sensor electrode. Particularly, the controller 210 may determine a sensor electrode outputting a sensor value, which is out of a first predetermined time reference range among the plurality of sensor electrodes, as a sensor electrode in which noise information is detected.

The controller 210 may convert a sensor electrode in which noise information is detected, among the plurality of sensor electrodes, into an inactive state. According to an embodiment, it may be possible to remove noise, which affects a reference value, by converting the sensor electrode in which noise information is detected, into the inactive state, and by preventing information, which is related to the sensor value outputting from the sensor electrode in which noise information is detected, from affecting on setting capacitance reference values of the input apparatus 200. In other words, it may be possible to perform the filtering of the noise, which is generated around the input apparatus 200, and to improve the accuracy of the calculation process of the reference value.

As for the inactive sensor electrode, the controller 210 may continuously monitor outputting sensor values of the corresponding sensor electrode. When it is detected that a sensor value of the inactive sensor electrode is in the reference range, the controller 210 may convert the inactive sensor electrode into an active state.

The controller 210 may determine a sensor electrode in which information about user proximity gestures is detected, among the plurality of sensor electrodes, as a currently used sensor electrode. Particularly, the controller 210 may determine a sensor electrode outputting a certain sensor value among the plurality of sensor electrodes, as a sensor electrode in which information about user proximity gestures is detected.

As for a process in which the controller 210 determines a currently used sensor electrode, the controller 210 may firstly determine a sensor electrode outputting a certain sensor value among the plurality of sensor electrodes, as a sensor electrode in which information about user proximity gestures is detected. When a sensor value, which is out of the reference range, is output for equal to or longer than the first predetermined period of time, the controller 210 may determine the corresponding sensor electrode, as a sensor electrode in which noise information is detected.

In a case in which the controller 210 randomly selects a sensor electrode (or subset of sensor electrodes) among the plurality of the sensor electrodes, the controller 210 may determine a capacitance reference value of the input apparatus 200 based on information about sensor values collected from the subset of sensor electrodes, which is not adjacent to each other among the plurality of the sensor electrodes. According to an embodiment, the input apparatus 200 may randomly select sensor electrodes, which are not adjacent to each other, among the plurality of the sensor electrodes, and determine a capacitance reference value of the input apparatus 200 based on information about sensor values collected from the sensor electrodes, which are randomly selected. Accordingly, it may be possible to reduce an amount of data, which is processed when calculating reference values, and to improve a processing speed.

Hereinafter according to an embodiment a noise filtering method of the input apparatus 200 will be described in details.

Figure 5:
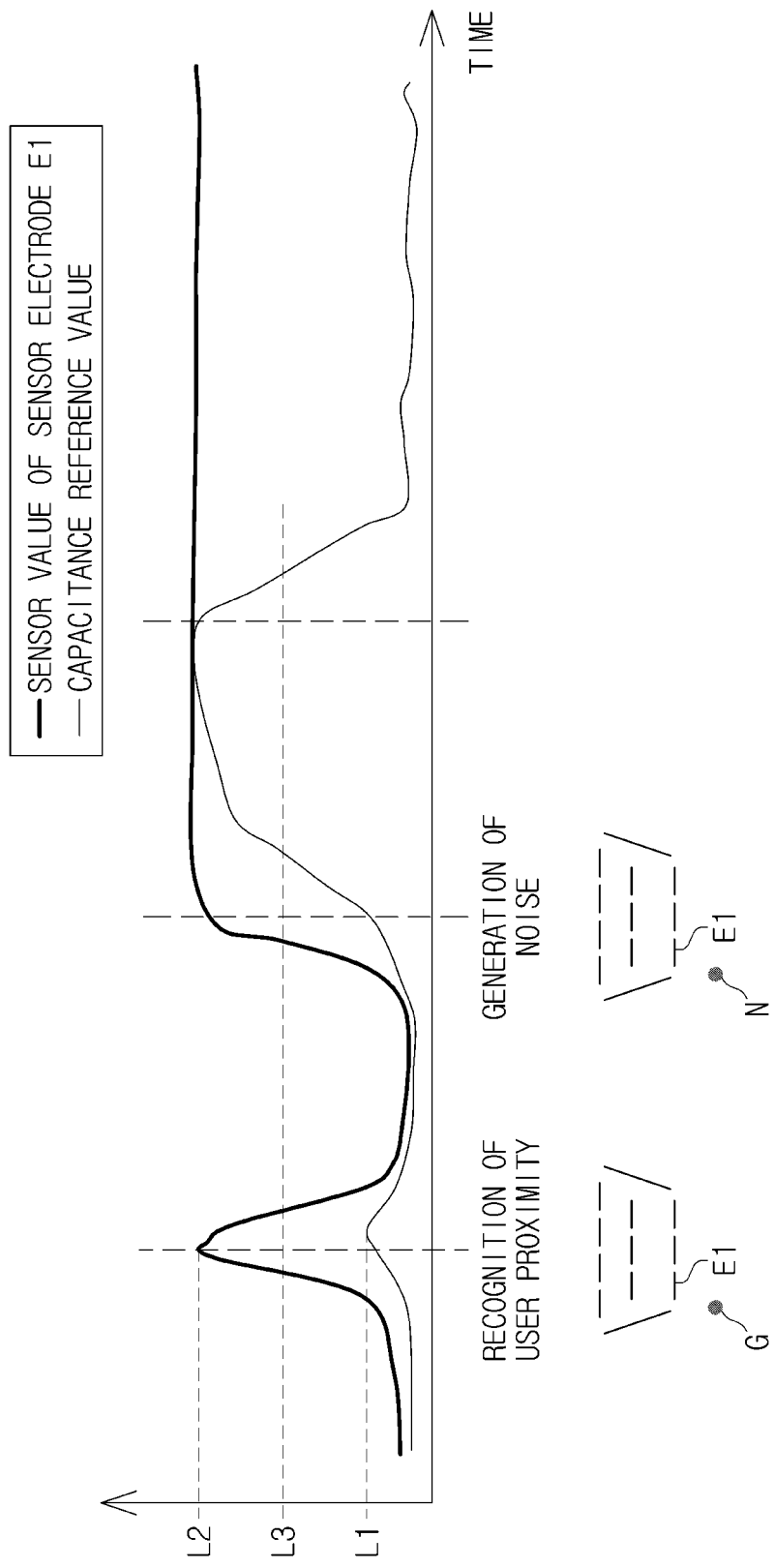
FIG. 5 is a graph illustrating a noise filtering method of the input apparatus.

FIG. 5 is a graph illustrating a noise filtering method of the input apparatus 200.

The graph of FIG. 5 illustrates a sensor value of a sensor electrode (E1) and a capacitance reference value, which is determined by the controller 210 of the input apparatus 200, when it is assumed that a user gesture (G) and noise (N) are generated in a detection area of the sensor electrode (E1).

Referring to FIG. 5, when a user proximity gesture is generated in the detection area of the sensor electrode (E1), the output of the sensor value of a sensor electrode (E1) may be increased to a value L2 and then restored to an initial state.

The controller 210 may determine a capacitance reference value of the input apparatus 200 based on information about sensor values collected from the subset of sensor electrodes, which are randomly collected except the sensor electrode (E1), among the plurality of the sensor electrodes. According to an embodiment, the capacitance reference value of the input apparatus 200 may be increased to a value L1, which is smaller than the value L2, and then restored to an initial state, as illustrated in FIG. 5.

When the noise (N) is generated in the detection area of the sensor electrode (E1), the sensor electrode (E1) may continuously output a sensor value similar with the L2 value.

When a sensor value of the sensor electrode (E1), which is out of the reference range, is output for equal to or longer than the first predetermined period of time, the controller 210 may determine a sensor electrode outputting the corresponding sensor value, as the sensor electrode in which the noise information is detected, and then convert the corresponding sensor electrode into the inactive state. The reference range may be determined by the design of the designer. For example, the reference range may be determined as a value, which is any one value from the value L1 to the value L2, which is equal to or less than a value L3.

When a sensor value of the sensor electrode (E1), which exceeds the value L3, is output for equal to or longer than the first predetermined period of time, the controller 210 may determine the sensor electrode (E1), as the sensor electrode in which the noise information is detected, and then convert the sensor electrode (E1) into the inactive state.

The controller 210 may determine a capacitance reference value of the input apparatus 200 based on information about sensor values collected from the plurality of sensor electrodes, which are randomly collected except the sensor electrode in which the noise information is detected among the plurality of the sensor electrodes. Accordingly, the capacitance reference value of the input apparatus 200 may be increased to a value that is approximate to the value L2 and then after the first predetermined period of time is expired, the capacitance reference value of the input apparatus 200 may be restored to the initial state.

Hereinbefore the method of filtering the noise generated in the detection area of the input apparatus 200 and calculating the capacitance reference value has been described.

As for the input apparatus 200 according to an embodiment, the plurality of sensor electrodes may be arranged in a variety of methods other than the method as illustrated in FIG. 4. Hereinafter for the understanding, modified embodiments related to the arrangement of the plurality of sensor electrodes will be described.

Figure 6:
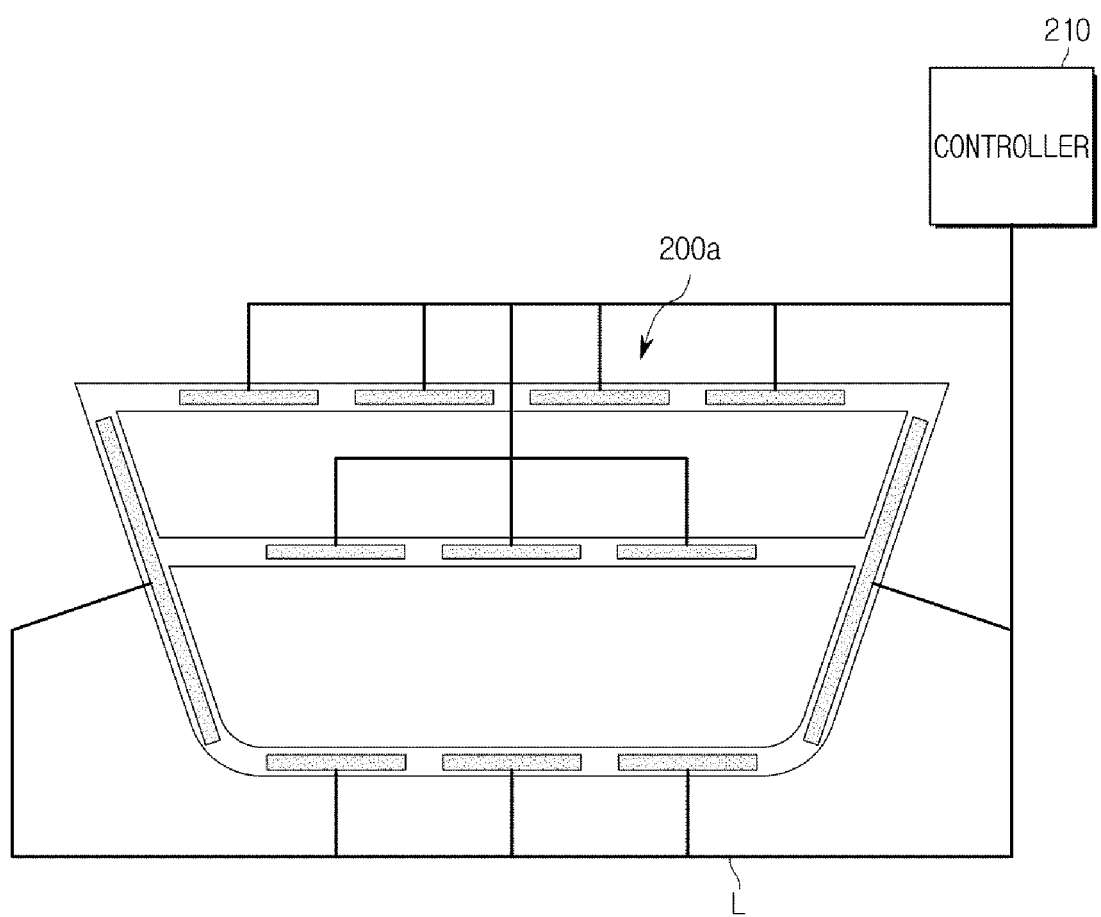
FIG. 6 is a view illustrating a structure of an input apparatus in accordance with another embodiment of the present disclosure.
Figure 7:
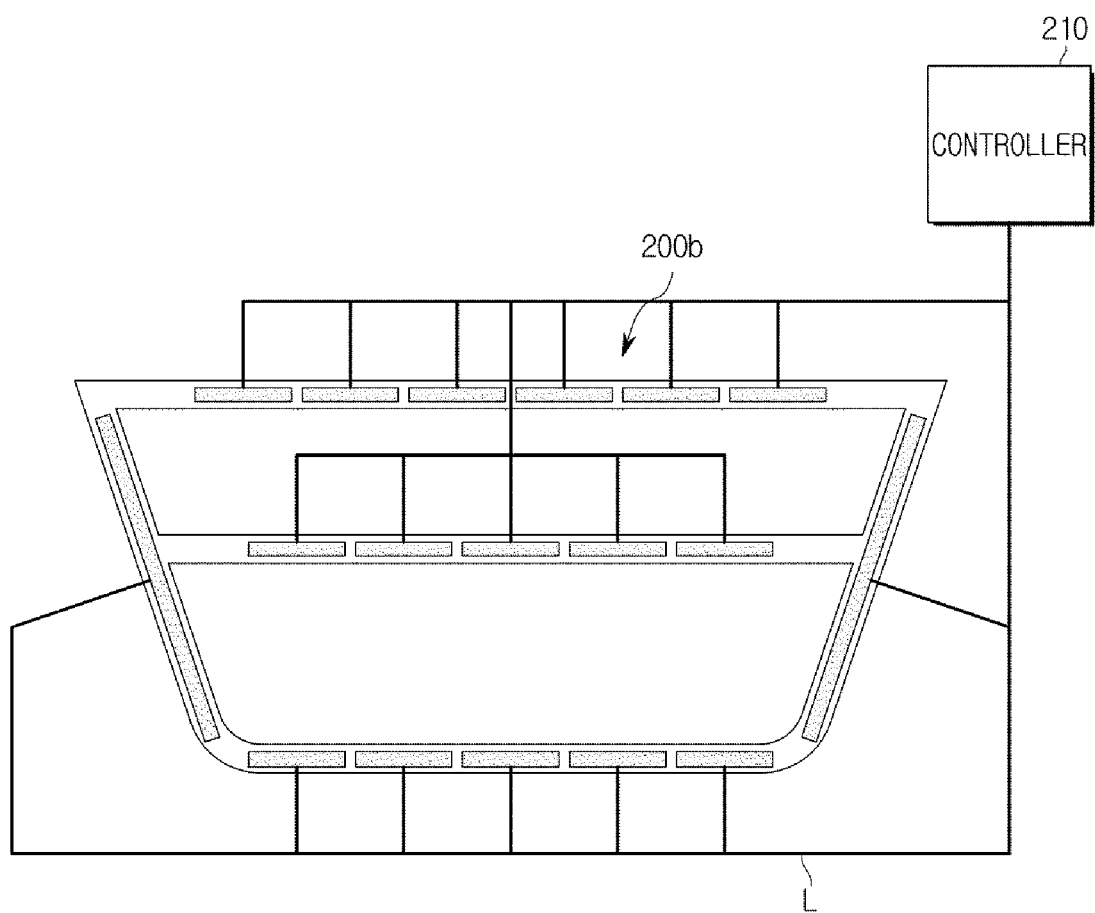
FIG. 7 is a view illustrating a structure of an input apparatus in accordance with another embodiment of the present disclosure.

FIG. 6 is a view illustrating a structure of an input apparatus 200*a* in accordance with another embodiment of the present disclosure, and FIG. 7 is a view illustrating a structure of an input apparatus 200*b* in accordance with another embodiment of the present disclosure.

Referring to FIG. 6, according to another embodiment, the input apparatus 200*a* may be provided such that a plurality of sensor electrodes having different sizes is provided, and the plurality of the sensor electrodes is arranged at a certain interval.

For example, as for the input apparatus 200*a*, sensor electrodes having a small size may be densely arranged in an area in which the noise occurrence is relatively high, and thus it may be possible to effectively filter the noise when setting the capacitance reference value. Conversely, sensor electrodes having a large size may be sparsely arranged in an area in which the noise occurrence is relatively low, and thus it may be possible to minimize an amount of data, which is processed when calculating reference values.

Referring to FIG. 7, according to another embodiment, the input apparatus 200*b* may be provided such that a plurality of sensor electrodes is densely arranged at a constant interval. As illustrated in FIG. 7, when the plurality of sensor electrodes is densely arranged at the constant interval, it may be possible to improve the sensing sensitivity of the input apparatus 200*b* as a whole.

Hereinbefore the structure and the operation method of the input apparatus 200, 200*a* and 200*b* have been described. Hereinafter a controlling method of the input apparatus 200 will be described according to an embodiment. A controlling method of the input apparatus 200*a* and the input apparatus 200*b* as illustrated in FIGS. 6 and 7 is similar to the controlling method of the input apparatus 200 as illustrated in FIG. 4 and thus for convenience of the description, the controlling method of the input apparatus 200 will be described with reference to the input apparatus 200 as illustrated in FIG. 4.

Figure 8:
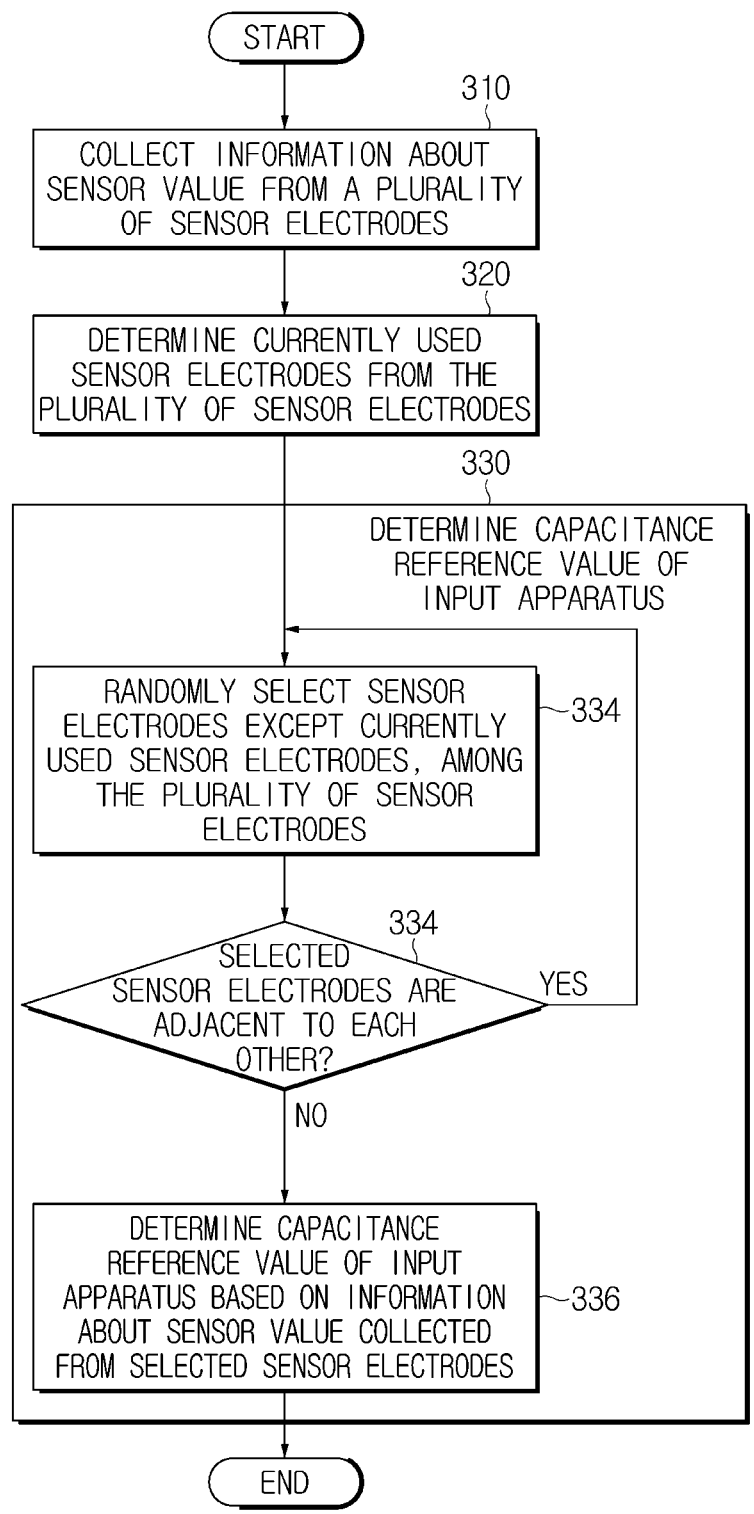
FIG. 8 is a flowchart illustrating a controlling method of the input apparatus in accordance with an embodiment.

FIG. 8 is a flowchart illustrating a controlling method of the input apparatus 200 in accordance with an embodiment.

Referring to FIG. 8, a controlling of the input apparatus 200 may include collecting information about sensor values from the plurality of sensor electrodes 310, determining a currently used sensor electrode from the plurality of sensor electrodes 320 and determining capacitance reference value of the input apparatus 200 based on information about sensor values from a subset of sensor electrodes, which is randomly selected from the plurality of sensor electrodes 330.

The collection of the information about sensor values from the plurality of sensor electrodes may be performed 310. The plurality of sensor electrodes may monitor a detection area of each sensor electrode at a predetermined interval, and output collected information about sensor values to the controller 210. For example, the controller 210 may output information about N sensor values received from N sensor electrodes, to the controller 210.

The controller 210 may determine a currently used sensor electrode among the plurality of sensor electrodes based on the information about sensor values received from the plurality of sensor electrodes 320. For example, the controller 210 may determine a currently used sensor electrode among N sensor electrodes based on information about sensor values received from N sensor electrodes.

The controller 210 may determine a sensor electrode in which noise information is detected or information about user proximity gestures is detected among the plurality of sensor electrodes, as the currently used sensor electrode.

The controller 210 may determine a sensor electrode outputting a sensor value, which is out of the reference range, for equal to or longer than the first predetermined period of time, as a sensor electrode in which the noise information is detected. In addition, the controller 210 may determine a sensor electrode outputting a certain sensor value, among the plurality of sensor electrodes, as a sensor electrode in which information about user proximity gestures is detected.

For example, among N sensor electrodes, A sensor electrodes may be determined as the sensor electrode in which the noise information is detected, and B sensor electrodes may be determined as the sensor electrode in which the information about user proximity gestures is detected.

The controller 210 may determine the capacitance reference value of the input apparatus 200 based on information about sensor values from a subset of sensor electrodes, which is randomly selected from the plurality of sensor electrodes 330. Particularly, the controller 210 may randomly select a subset of sensor electrodes, except the currently used sensor electrode, from the plurality of sensor electrodes 332.

For example, the controller 210 may secure M standby sensor channels in which A sensor electrodes, which are determined as the sensor electrode in which the noise information is detected, and B sensor electrodes, which are determined as the sensor electrode in which the information about user proximity gestures is detected, are excepted from N sensor electrodes, wherein the number of the standby sensor channel corresponds to M that is obtained by subtracting A and B from N (i.e. M=N−A−B). The controller 210 may randomly select C sensor electrodes among M standby sensor channels.

The controller may determine whether selected sensor electrodes are adjacent to each other or not (334). According to an embodiment, the input apparatus 200 may determine the capacitance reference value of the input apparatus 200 based on information about sensor values collected from the plurality of sensor electrodes, which is not adjacent to each other. In other words, the controller 210 may select the subset of sensor electrodes, which is not adjacent to each other when randomly selecting the subset of sensor electrodes, and determine the capacitance reference value of the input apparatus 200 based on information about sensor values collected from the plurality of sensor electrodes, which is not adjacent to each other.

When a subset of sensor electrodes, which is adjacent to each other, is present among randomly selected sensor electrodes, the controller 210 may return to the step 322 (334 and 332).

The controller 210 may determine the capacitance reference value of the input apparatus 200 based on information about sensor values collected from the plurality of sensor electrodes, when the randomly selected sensor electrodes is not adjacent to each other (336).

For example, when a subset of sensor electrodes adjacent to each other, is present among C sensor electrodes, which is randomly selected, the controller 210 may return to the step 322 and reselect C sensor electrodes. Meanwhile, when a subset of sensor electrodes adjacent to each other, is not present among C sensor electrodes, which is randomly selected, the controller 210 may determine the capacitance reference value of the input apparatus 200 based on information about sensor values collected from the selected C sensor electrodes.

As is apparent from the above description, the input apparatus allows the calculation speed to be improved by excluding information about sensor values, which are affected by the noise around the input apparatus, from a process of calculating the capacitance reference value of the input apparatus.

The input apparatus allows the calculation speed to be improved by calculating a reference value by excluding some sensor values, when calculating the capacitance reference value of the input apparatus.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. An input apparatus, comprising:
a plurality of sensor electrodes; and
a controller configured to determine a capacitance reference value of the input apparatus based on information about sensor values collected from a subset of sensor electrodes, which is randomly selected from the plurality of sensor electrodes,
wherein the capacitance reference value is used to determine whether an object is approaching the input apparatus,
wherein the controller determines a capacitance reference value of the input apparatus based on information about the sensor values collected from the subset of sensor electrodes, which is randomly selected except a currently used sensor electrode from the plurality of sensor electrodes, and
wherein the controller determines a sensor electrode in which noise information is detected, among the plurality of sensor electrodes, as the currently used sensor electrode.

2. The input apparatus of claim 1, wherein,
the controller converts the sensor electrode, in which noise information is detected among the plurality of sensor electrodes, into an inactive state.

3. The input apparatus of claim 2, wherein,
the controller determines a sensor electrode outputting a sensor value out of a reference range for equal to or longer than a first predetermined period of time, as the sensor electrode in which noise information is detected among the plurality of sensor electrodes.

4. The input apparatus of claim 3, wherein,
when it is detected that a sensor value of the inactive sensor electrode is in the reference range, the controller converts the inactive sensor electrode into an active state.

5. The input apparatus of claim 1, wherein,
the controller determines a sensor electrode in which information about user proximity gesture is detected among the plurality of sensor electrodes as the currently used sensor electrode.

6. The input apparatus of claim 1, wherein,
the controller determines a capacitance reference value of the input apparatus based on information about the sensor values collected from the subset of sensor electrodes, which is not adjacent to each other among the plurality of sensor electrodes.

7. The input apparatus of claim 1, wherein:
the plurality of sensor electrodes is arranged at a certain interval.

8. The input apparatus of claim 1, wherein:
the plurality of sensor electrodes is arranged in a certain shape.

9. The input apparatus of claim 1, wherein:
the input apparatus is installed in a center fascia of a vehicle.

10. A control method of an input apparatus comprising:
collecting information about sensor values from a plurality of sensor electrodes;
determining a capacitance reference value of the input apparatus based on information about the sensor values from a subset of sensor electrodes, which is randomly selected from the plurality of sensor electrodes; and
determining a sensor electrode in which noise information is detected among the plurality of sensor electrodes as a currently used sensor electrode,
wherein the capacitance reference value is used to determine whether an object is approaching the input apparatus, and
wherein the determination of the capacitance reference value of the input apparatus comprises determining a capacitance reference value of the input apparatus based on information about the sensor values collected from the subset of sensor electrodes, which is selected except the currently used sensor electrode from the plurality of sensor electrodes.

11. The control method of claim 10, further comprising:
converting the sensor electrode, in which noise information is detected among the plurality of sensor electrodes, into an inactive state.

12. The control method of claim 10, wherein:
the determination of the sensor electrode in which noise information is detected among the plurality of sensor electrodes, as the currently used sensor electrode, comprises determining a sensor electrode outputting a sensor value out of a reference range for equal to or longer than a first predetermined period of time, as a sensor electrode, in which noise information is detected among the plurality of sensor electrodes.

13. The control method of claim 10, further comprising:
determining a sensor electrode, in which information about user proximity gesture is detected among the plurality of sensor electrodes, as the currently used sensor electrode.

14. The control method of claim 10, wherein:
the determination of the capacitance reference value comprises determining a capacitance reference value of the input apparatus based on information about sensor values collected from a plurality of sensor electrodes, which is not adjacent to each other among the plurality of sensor electrodes.

* * * * *